United States Patent [19]

Hoshizaki et al.

[11] Patent Number: 5,187,394

[45] Date of Patent: Feb. 16, 1993

[54] CONFIGURABLE ROW DECODER DRIVER CIRCUIT

[75] Inventors: Gary W. Hoshizaki, Mesa; Glen Caby; Robert A. Fuller, both of Gilbert, all of Ariz.

[73] Assignee: Motorola, Inc., Schaumburg, Ill.

[21] Appl. No.: 819,731

[22] Filed: Jan. 13, 1992

[51] Int. Cl.[5] ............................................. H03K 19/01
[52] U.S. Cl. ..................................... 307/449; 307/446; 307/463
[58] Field of Search ............... 307/449, 463, 446, 443; 365/230.06

[56] References Cited

U.S. PATENT DOCUMENTS

| | | | |
|---|---|---|---|
| 4,491,748 | 1/1985 | Chappell et al. | 307/449 |
| 4,567,581 | 1/1986 | Dumbri et al. | 307/449 |
| 4,725,743 | 8/1986 | Anderson | 307/449 |
| 4,798,977 | 1/1989 | Sakui et al. | 307/463 |
| 5,118,972 | 6/1992 | Wissel et al. | 307/446 |

OTHER PUBLICATIONS

O'Connor, "Row-Address-Decoder-Driver Circuit", U.S. Statutory Invention Registration H97, Aug. 5, 1986.

Primary Examiner—David Hudspeth
Assistant Examiner—Jon Santamauro
Attorney, Agent, or Firm—Joe E. Barbee

[57] ABSTRACT

A configurable decode circuit for decoding in a block architected SRAM. The configurable decode circuit comprising a decode circuit (10) which decodes through a process of deselection, a first buffer circuit (12) for buffering decode circuit (10), a delayed clock signal (15) for enabling first buffer circuit (12), a gated transmission means (13) for decoupling first buffer circuit from second buffer circuit (14), second buffer circuit (14) for driving capacitive loads, and a means for delaying driver output (16) for enabling gated transmission means (13). The decode circuit (10) is built for simplifying synthesis of the layout of a configurable decode circuit for varying configurations. The configurable decode optimizes performance by reducing the number of circuits in the critical delay path and minimizing capacitive loading on internal circuit nodes.

13 Claims, 4 Drawing Sheets

CONFIGURABLE ROW DECODER DRIVER CIRCUIT

BACKGROUND OF THE INVENTION

This invention relates, in general, to decoding circuits, and more particularly to row decoding circuits used in block architected static random access memories (SRAMs) built for compiler applications.

A SRAM compiler is a computer program which can synthesize different configurations of memory (variable wordwidth and number of words in the memory) for a SRAM. A SRAM compiler program creates a netlist of the memory, simulates the worst case delay path through the memory to generate timing information, builds a symbol of the SRAM for placement in a schematic, builds a simulation model with the timing information, creates a physical layout of the SRAM, builds a routing abstraction of the SRAM, and creates a power grid structure for the SRAM. The SRAM compiler is used to generate memories for application specific integrated circuits (ASICs), wherein the SRAM is only one component of many used in the design of the application specific integrated circuit.

Initial attempts at building compilable decode stages focused on the extremely fast Nand and Nor decode stages used in full custom SRAMs for the consumer market. Although fast, the Nand and Nor decode stages proved cumbersome when implemented in a compiler for synthesizing random customer SRAM configurations. The computer code necessary for the synthesis programs proves to be extremely complex, resource intensive, and requires considerable development time. This approach was soon abandoned.

First generation SRAM compilers, and more specifically the decode stages, were designed to simplify the synthesis of the decode stage and the construction of the physical layout. The SRAM compilers were designed having a single block of memory which is not optimal for performance at larger memory sizes. Although compilers are capable of synthesizing a SRAM for most applications, it has become evident that users expect performance levels and SRAM densities equivalent to the full custom SRAM market place. Most compiled SRAMs are much slower than full custom designs due to the compromises in building a configurable circuit.

One method for enhancing the speed of the SRAM is to divide a large single block of memory into smaller individual blocks of memory. Depending on the decoding scheme, each block of memory can be accessed separately or multiple blocks can be accessed simultaneously. An additional stage of decoding (row and block decoders for each memory block) must be added to the SRAM to access individual blocks, but performance is gained by the reduction of parasitic capacitance and resistance associated with the memory block's smaller size, thereby, increasing the speed of circuits which drive the smaller blocks. This method is known as a block architected SRAM.

Adding the extra circuitry needed to form the block architected SRAM increases the complexity of a compiler program. The additional block decode required further complicates the standard decode methodology.

There is a need for a decode circuit which simplifies compilation, yet is compatible with a block architected SRAM design, and has performance similar to full custom block architected SRAM designs.

SUMMARY OF THE INVENTION

Briefly stated, the present invention is achieved by creating a decoding circuit for a compiled block architected SRAM which simplifies synthesis of the physical layout and minimizes delay. The configurable decode circuit outputs a logic state signifying a select or deselect condition based on received address signals. A single unique address will cause the configurable decode circuit to generate a select condition. A clock signal controls the timing of a configurable decode circuit. The low phase of the clock signal intializes the circuit to preset conditions. The high phase of the clock signal initiates a decoding sequence.

The configurable decode circuit comprises a decode circuit which decodes through a process of deselection, a first buffer circuit for buffering the decode circuit, a delayed clock signal for enabling the first buffer circuit, a gated transmission means for decoupling the first buffer circuit from a second buffer circuit, the second buffer circuit for driving capacitive loads, and a means for delaying an output signal from the second buffer circuit for enabling the gated transmission means. The decode circuit is configurable and can be synthesized by abutting n-channel enhancement MOSFETs.

DETAILED DESCRIPTION OF THE DRAWINGS

Figure 1:
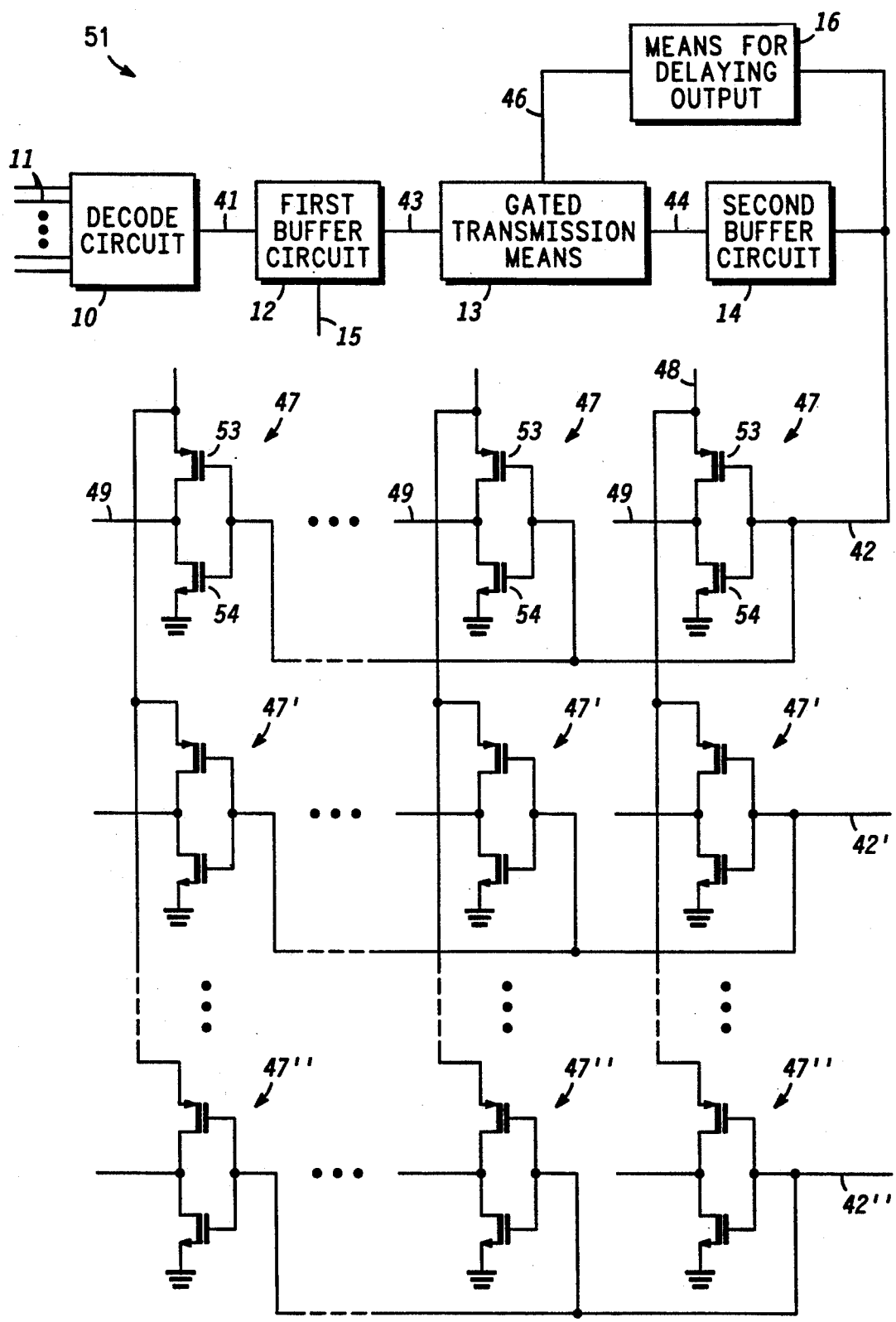
FIG. 1 is a block diagram of a configurable decode circuit driving a plurality of row/block decoders.

FIG. 1 illustrates a block diagram of a configurable decode circuit 51. A plurality of configurable decode circuits 51 are used in a block architected SRAM. The block architected SRAM comprises a plurality of memory blocks, each memory block comprises a plurality of memory cell rows. Each configurable decode circuit 51 corresponds to a predetermined memory cell row in each memory block. Configurable decode circuit 51 receives a plurality of binary address signals 11 and provides a second buffer output signal 42 for enabling the predetermined memory cell row in each memory block. Configurable decode circuit 51 receives N binary address signals 11 having $2^N$ different address signal combinations. Each different binary address signal combination is assigned to a predetermined configurable decode circuit 51 thereby allowing $2^N$ memory cell rows to be decoded. N address signals and N complemented binary address signals are used for providing input signals for the configurable decode circuits 51. Each configurable decode circuit 51 receives a combination of complemented and non-complemented binary address signals which are all in a zero logic state only when the assigned address is input. This is achieved by using the complemented binary address signals to replace the non-complemented binary address signals that are in a one logic state for the assigned binary address signal. Thus, each binary address signal combination input to the plurality of configurable decode circuits 51 will generate a single address signal combination of all zero logic states, all other configurable decode circuits 51 will receive at least one address signal in a one logic state.

Prior to starting a decode sequence, decode output signal 41 is in a logic state signifying a select condition and binary address signals 11 are in a zero logic state (to prevent decode circuit 10 from changing decode output signal 41). The decode sequence starts when address signals 11 are received by decode circuit 10. Any address signal which transitions from a zero logic state to a one logic state will cause decode circuit 10 to transition decode output signal 41 from the select condition to a logic state signifying a deselect condition.

A first buffer circuit 12 buffers decode circuit 10 from capacitive loads and inhibits decode output signal 41, preset to the select condition, from propagating through configurable decode circuit 51. First buffer circuit 12 receives decode output signal 41, receives a delayed clock signal 15, and provides a first buffer output signal 43. Prior to starting the decode sequence first buffer output signal 43 is in a logic state signifying a deselect condition. During the decode sequence, delayed clock signal 15, which is delayed a predetermined amount of time which will transition from a zero logic state to a one logic state after decode circuit 10 has settled to a final logic state. In the preferred embodiment, delayed clock signal 15 will minimize delay by transitioning from the zero logic state to the one logic state immediately following the maximum time needed to insure decode circuit 10 has settled to the final logic state. Delayed clock signal 15 in a one logic state enables first buffer circuit 12 to pass a deselect or select condition from the decode circuit to gated transmission means 13.

Gated transmission means 13 is a gated switch for passing first buffer output signal 43 to a second buffer circuit 14. Gated transmission means 13 receives first buffer output signal 43, receives a delayed driver output signal 46, and provides a gated output signal 44. Delayed driver output signal 46 enables gated transmission means 13 prior to starting the decode sequence.

Second buffer circuit 14 receives gated output signal 44 and provides second buffer output signal 42. Second buffer circuit 14 is loaded down with a capacitive load comprising a plurality of row/block decoders 47 and means for delaying output signal 16. Prior to starting the decode sequence second buffer output signal 42 is in a logic state signifying a deselect condition. Second buffer circuit 14 is built to drive metal interconnect and circuit loads from each memory block of a block architected SRAM.

Means for delaying driver output 16 receives the second buffer output signal 42 and provides a delayed output signal 46 which is delayed a predetermined amount of time. Prior to starting the decode sequence, delayed output signal 46 enables gated transmission means 13. Delayed output signal 46 will disable gated transmission means 13 after the predetermined amount of time when second buffer output signal 42 transitions from the deselect condition to a logic state signifying a select condition during the decode sequence. This decouples first buffer circuit 12 from second buffer circuit 14 and allows a reinitialization process to begin.

Capacitive loading on second buffer circuit 14 comprises a plurality of row/block decoders 47 and means for delaying output 16. Each row/block decoder 47 comprises a p-channel enhancement MOSFET 53 and a n-channel enhancement MOSFET 54 configured as a switched inverter. P-channel enhancement MOSFET 53 and n-channel enhancement MOSFET 54 have common gates coupled for receiving second buffer output signal 42 and common drains for providing memory row signal 49. N-channel enhancement MOSFET 54 has a source coupled to ground. P-channel enhancement MOSFET 53 has a source receiving a block decode signal 48.

Row/block decoder 47 provides memory row signal 49 for enabling a row of memory. Block decode signal 48 and second buffer output signal 42 must both be in a logic state signifying a select condition for row/block decoder 47 to enable the row of memory. A memory block comprises a plurality of memory cell rows. A row/block decoder 47 is needed for every memory cell row in each memory block. Each configurable decode circuit 51 corresponds to a predetermined row/block decoder 47, 47', 47'' in each memory block and provides a second buffer output signal 42, 42', 42'' to the corresponding row/block decoder 47 in each memory block. Each row/block decoder 47 in a memory block receives a common block decode signal 48. Increasing the number of memory blocks increases capacitive loading on the configurable decode circuit thereby slowing decode speeds.

Figure 2:
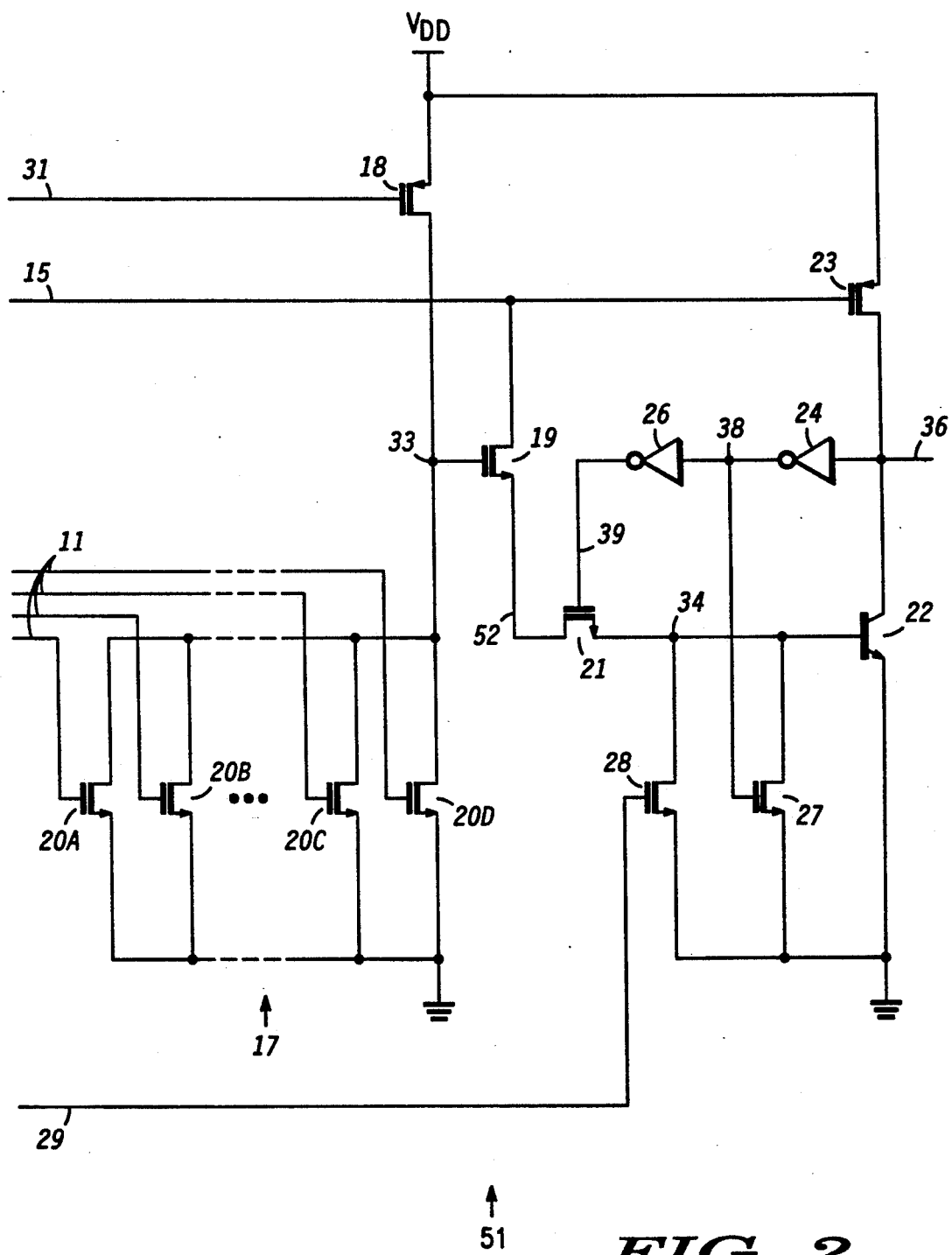
FIG. 2 is a circuit schematic of the configurable decode circuit of FIG. 1.

FIG. 2 illustrates the preferred circuit implementation of configurable decode circuit 51 shown in FIG. 1. Inverted clock signal 29 and clock signal 31 control initialization of the configurable decode circuit and start a decode sequence.

All nodes in the configurable decode circuit are preset to a predetermined voltage prior to starting the decode sequence. Initialization (prior to starting the decode sequence) of the nodes occurs as follows: Clock signal 31, delayed clock signal 15, and address signals 11 are all in a zero logic state. Inverted clock signal 29 is in a one logic state prior to starting the decode sequence. N-channel enhancement MOSFET 28 is enabled by inverted clock signal 29 initializing node 34 to ground. P-channel enhancement MOSFET 23 is enabled by delayed clock signal 15 initializing node 36 to Vdd. Inverter 24 will initialize node 38 to ground and inverter 26 will initialize node 39 to Vdd. Decoding element 17 will be disabled by address signals 11 in the zero logic state. P-channel enhancement MOSFET 18 is enabled by zero logic state clock signal 31 and initializes node 33 to voltage Vdd. N-channel enhancement MOSFET 21 is enabled by Vdd on node 39. Node 52 is initialized to ground by n-channel enhancement MOSFETs 28 and 21.

Precharging nodes to the predetermined voltages prior to the start of the decode sequence minimizes capacitance loading (by utilizing a single MOSFET to initialize a node) thereby increasing speed, reduces circuit area (fewer transistors needed due to reduced logic requirements), and allows the configurable decode circuit to perform consistently due to identical starting conditions.

Decoding element 17 comprises a plurality of n-channel enhancement MOSFETs 20a, 20b, 20c, and 20d having common drains and having common sources coupled to ground. Each gate of n-channel enhancement MOSFETs 20a, 20b, 20c, and 20d receive an address signal 11 for enabling the MOSFET. Since a compiler program synthesizes a SRAM for a specific application, the configurable decode circuit simplifies synthesis by minimizing the number of elements within the circuit which vary from one SRAM to another. A physical layout compiler builds the configurable decoder.

Therefore, how the decoder is constructed determines the complexity of the layout compiler program.

Configurable decode circuit decoding is limited to $2^N$ where N is the number of binary address signals used for decoding. Decode element 17 of the configurable decode circuit varies with the N binary address signals having N n-channel enhancement MOSFETs to receive the binary address signals. Synthesis of the physical layout of the configurable decode circuit for different configurations is limited to abutting the N n-channel enhancement MOSFETs in the physical layout to form decoding element 17. A physical layout of an n-channel enhancement MOSFET uses connection points brought out to the boundaries of the physical layout. Tiling (or abutting) layouts of the n-channel enhancement MOSFETs create decoding element 17. Interconnect between n-channel enhancement MOSFET's physical layout is created by forming a continuous path of the connection points brought out to the boundaries of the layout.

P-channel enhancement MOSFETs 18 and 23, n-channel enhancement MOSFETs 19, 21, 27, and 28, inverters 24 and 26, and bipolar transistor 22 are constant (or the same) for any configurable decode circuit configuration.

Decoding element 17 and p-channel enhancement MOSFET 18 comprise a decode circuit. During the decode sequence any address signal received by decoding element 17 which transitions from a zero logic state to a one logic state will cause decoding element 17 to discharge preset node 33 to ground which signifies a deselect condition. This is a decoding process by deselection since all address signal combinations except the single unique address combination cause node 33 to transition to the deselect condition. The single unique address signal combination occurs when all address signals stay in the zero logic state during the decode sequence. Performance is enhanced by eliminating the need for circuitry to generate the select condition thereby removing parasitic capacitance of the eliminated circuitry and allowing optimization of the deselect path through the configurable decode circuit. Also, using n-channel enhancement MOSFETs in decoding element 17 (which typically have 2-3 times the carrier mobility of p-channel enhancement MOSFETs) optimizes performance in deselecting the preset select condition.

N-channel enhancement MOSFET 19 is in a voltage follower configuration and buffers node 33 from capacitive loads. N-channel enhancement MOSFET 19 has a gate coupled to node 33, having a drain coupled to delayed clock signal 15, and a source providing drive to node 52. Using the voltage follower configuration maximizes performance of decoding element 17 for high address signal counts by minimizing capacitance loading on node 33. If node 33 remains in the select condition during the decode sequence, n-channel enhancement MOSFET 19 will be enabled. N-channel enhancement MOSFET 28 is disabled by inverted clock signal 29 in a zero logic state. N-channel enhancement MOSFET 27 is disabled by the zero logic state on node 38. Node 52 will follow the voltage of delayed clock signal 15. In the preferred embodiment, delayed clock signal 15 transitions from a zero logic state to a one logic state as quickly as possible thereby charging node 52 in the shortest time possible and minimizing delay (if node 33 is in the select condition). If node 33 is in the deselect condition n-channel enhancement MOSFET 19 will be disabled and node 52 will remain in a zero logic state during the decode sequence.

N-channel enhancement MOSFET 21 acts as a gated switch electrically connecting node 52 to node 34. N-channel enhancement MOSFET 21 has a drain coupled to node 52, a gate coupled to node 39, and a source coupled to node 34. Prior to starting the decode sequence both node 52 and node 34 are in a zero logic state, node 39 is in a one logic state enabling n-channel enhancement MOSFET 21. During the decode sequence with a select condition at node 33, node 52 will eventually transition from a zero logic state to a one logic state. N-channel enhancement MOSFET 21 is enabled and passes current which charges up node 34. If node 33 is in a deselect state during the decode sequence n-channel enhancement MOSFET 19 is disabled and both node 52 and node 34 stay in the zero logic state.

Bipolar transistor 22 is used to discharge node 36 from the preset voltage Vdd. Bipolar transistor 22 has a base coupled to node 34, an emitter coupled to ground, and a collector coupled to node 36. If node 33 is in a select condition during the decode sequence, node 34 will begin to charge up and supply base current to enable bipolar transistor 22. Node 36 is rapidly discharged to a zero logic state once bipolar transistor 22 is enabled. If node 33 is in a deselect condition during the decode sequence node 34 remains in a zero logic state and bipolar transistor 22 remains disabled.

Inverter 24 and inverter 26 create a delayed inverted signal (at node 38) and a delayed non-inverted signal (at node 39) of a logic state transition at node 36. If node 36 transitions from the preset voltage Vdd to a zero logic state during the decode sequence, inverter 24 will transition node 38 from a zero logic state to a one logic state and inverter 26 will transition node 39 from a one logic state to a zero logic state. Node 38 transitioning to a one logic state enables n-channel enhancement MOSFET 27. Node 39 transitioning to a zero logic state disables n-channel enhancement MOSFET 21 which decouples node 34 from node 52. Enabled n-channel enhancement MOSFET 27 discharges node 34, brings bipolar transistor 22 out of saturation, and disables bipolar transistor 22 as node 34 transitions to ground. The delay of inverter 24 and inverter 26 insure node 36 transitions to a zero logic state before node 52, which supplies base drive to bipolar transistor 22, is decoupled from node 34.

Reinitialization of the configurable decode circuit starts when clock signal 31 transitions from a one logic state to a zero logic state, inverted clock signal 29 transitions from a low logic state to a one logic state, and address signals 11 all return to a zero logic state. Bipolar transistor 22 must be disabled (node 34 in a zero logic state) before reinitialization begins.

Figure 3:
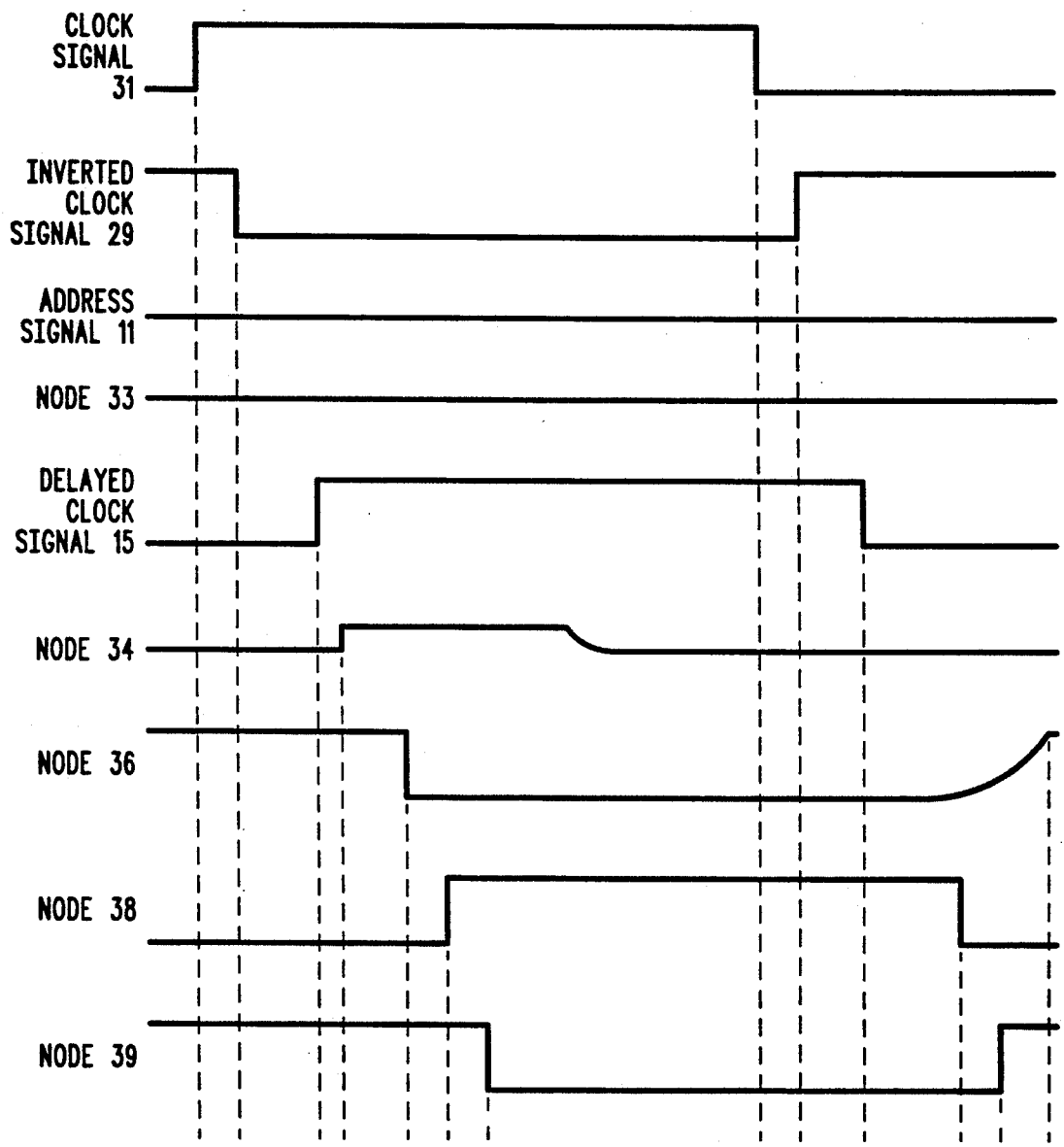
FIG. 3 is a timing diagram for the configurable decode circuit generating a select condition.

FIG. 3 illustrates timing diagrams of key events which occur during a decode sequence which generates a logic state signifying select condition at node 36. All nodes in the configurable decode circuit are initialized to preset logic states before the decoding sequence begins. Nodes and signals in timing diagram 3 correspond to nodes and signals in FIG. 2.

Clock signal 31 starts the decode sequence by transitioning from a zero logic state to a one logic state. P-channel enhancement MOSFET 18 of FIG. 2 is disabled by clock signal 31.

Inverted clock signal 29 transitions from a one logic state to a zero logic state one inverter delay after clock signal 31 transitions. N-channel enhancement MOS- FET 28 of FIG. 2 is disabled by inverted clock signal 29.

It should be noted that clock signal 31 leading inverted clock signal 29 is not a critical timing element of the configurable decode circuit. Inverted clock signal 29 could lead clock signal 31. The delay between the two signals should be kept as small as possible.

Address signals 11 do not transition from a zero logic state during the decode sequence, therefore decoding element 17 of FIG. 2 is disabled.

Node 33 remains at the intialized one logic state during the decode sequence (held by parasitic capacitance from MOSFETs coupled to node 33). Node 33 in a one logic state enables n-channel enhancement MOSFET 19 of FIG. 2.

Delayed clock signal 15 transitions from a zero logic state to a one logic state a predetermined time after clock signal 31. P-channel enhancement MOSFET 23 of FIG. 2 is disabled by delayed clock signal 15. N-channel enhancement MOSFET 19 of FIG. 2 and n-channel enhancement MOSFET 21 of FIG. 2 are both enabled, delayed clock signal 15 charges up nodes 52 and 34 of FIG. 2.

Voltage on node 34 will rise with delayed clock signal 15 until the base-emitter junction of bipolar transistor 22 of FIG. 2 is forward biased. Enabled bipolar transistor 22 of FIG. 2 rapidly pulls down node 36 from the intialized one logic state to a zero logic state.

As node 36 transitions from a one logic state to a zero logic state inverter 24 of FIG. 2 causes node 38 to transition from a zero logic state to a one logic state one inverter delay later. Inverter 26 of FIG. 2 causes node 39 to transition from a one logic state to a zero logic state one inverter delay after node 38 transitions.

Node 38 in a one logic state enables n-channel enhancement MOSFET 27 of FIG. 2. Node 39 in a zero logic state disables n-channel enhancement MOSFET 21 of FIG. 2 decoupling node 52 of FIG. 2 from node 34 of FIG. 2, thereby allowing n-channel enhancement MOSFET 27 of FIG. 2 to discharge node 34 to ground. As node 34 discharges to ground, bipolar transistor 22 of FIG. 2 will be pulled out of saturation and disabled (this occurs before clock signal 31 transitions to a zero logic state).

Initialization of the configurable decode circuit begins when clock signal 31 transitions from the one logic state to a zero logic state.

Inverted clock signal 29 transitions from the zero logic state to a one logic state one inverter delay later.

Inverted clock signal 29 in the logic one state enables n-channel enhancement MOSFET 28 of FIG. 2 which holds node 34 in a zero logic state.

Delayed clock signal 15 transitions from the one logic state to a zero logic state the predetermined time after clock signal 31.

Delayed clock signal 15 in a zero logic state enables p-channel enhancement MOSFET 23 of FIG. 2 which precharges node 36 to a logic one state.

Node 36 transitioning to a logic one state will cause inverter 24 of FIG. 2 to transition node 38 from the logic one state to a logic zero state an inverter delay later.

Node 38 in the logic zero state disables n-channel enhancement MOSFET 27 of FIG. 2.

Node 38 transitioning to the zero logic state causes inverter 26 of FIG. 2 to transition node 39 from the zero logic state to a one logic state an inverter delay after node 38 transitions.

Node 39 in the one logic state enables n-channel enhancement MOSFET 21 thereby coupling node 52 of FIG. 2 to node 34.

Residual charge on node 52 of FIG. 2 is discharged through n-channel enhancement MOSFET 21 of FIG. 2 and n-channel enhancement MOSFET 28 of FIG. 2 or through n-channel enhancement MOSFET 19 of FIG. 2 to a zero logic state.

The configurable decode circuit is initialized for another decoding sequence.

Figure 4:
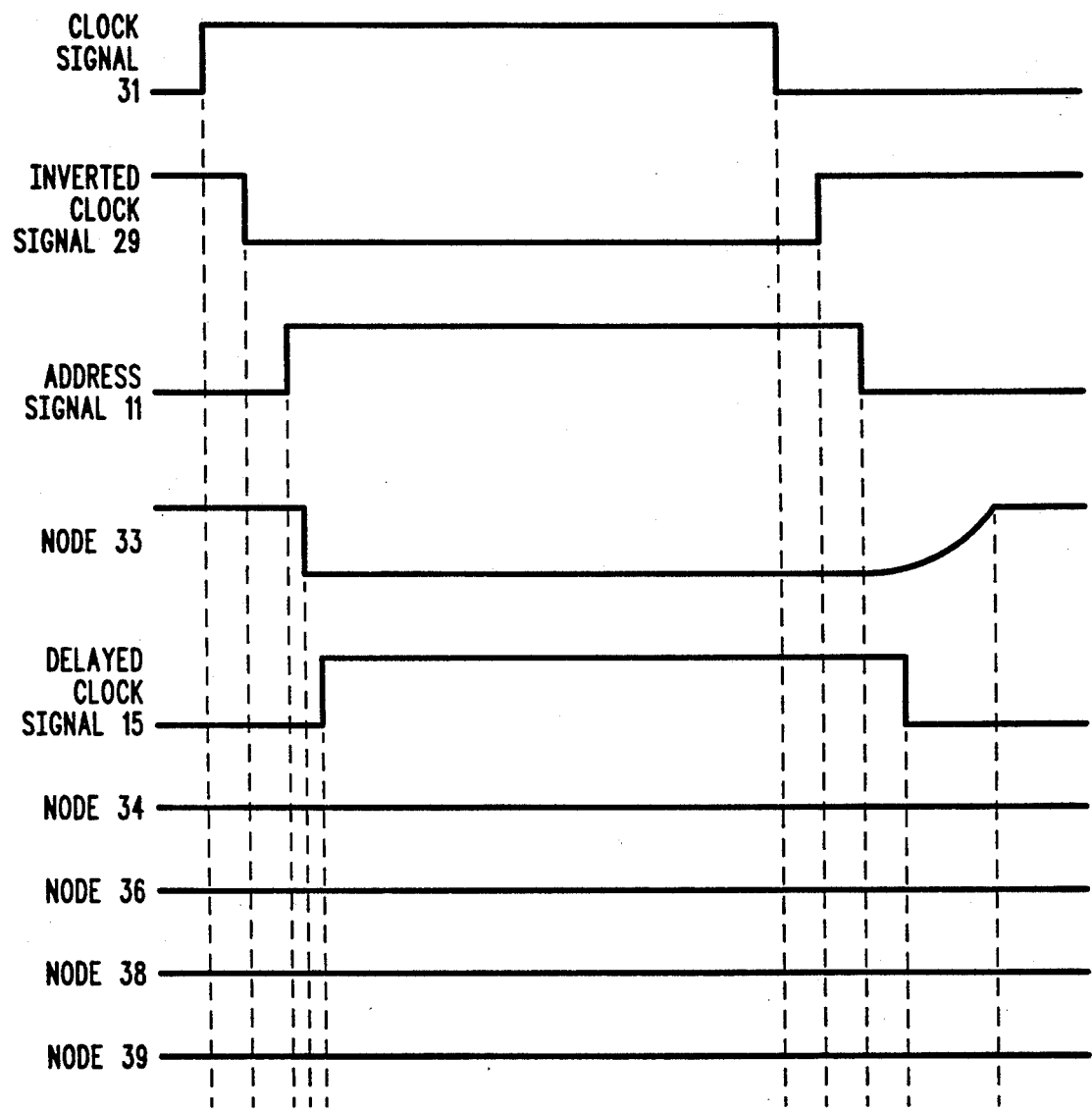
FIG. 4 is a timing diagram for the configurable decode circuit generating a deselect condition.

FIG. 4 illustrates timing diagrams of key events which occur during a decode sequence which generates a logic state signifying a deselect condition at node 36. All nodes in the configurable decode circuit are initialized to preset logic states before the decoding sequence begins. Nodes and signals in timing diagram 4 correspond to nodes and signals in FIG. 2.

Clock signal 31 starts the decoding sequence by transitioning from a zero logic state to a one logic state. P-channel enhancement MOSFET 18 of FIG. 2 is disabled by the one logic state of clock signal 31.

Inverted clock signal 29 transitions from a one logic state to a zero logic state an inverter delay after clock signal 31. N-channel enhancement MOSFET 28 of FIG. 2 is disabled by the zero logic state of inverted clock signal 29.

Address signals 11 propagate to the configurable decode circuit after inverted clock signal 29 transitions to the zero logic state. One or more of address signals 11 transition from a zero logic state to a one logic state. A single address transitioning from the zero logic state to the one logic state generates a worst case delay from decoding element 17 of FIG. 2. N-channel enhancement MOSFETs in decoding element 17 of FIG. 2 receiving the one logic state are enabled, thereby, discharging node 33 to a zero logic state. N-channel enhancement MOSFET 19 of FIG. 2 is disabled.

Delayed clock signal 15 transitions from a zero logic state to a one logic state after node 33 has transitioned to the zero logic state. In the preferred embodiment, delayed clock signal 15 transitions to the one logic state as close to the worst case delay from decoding element 17 (delay transitioning from a one logic state to a zero logic state) of FIG. 2 as possible. P-channel enhancement MOSFET 23 is disabled by delayed clock signal 15.

Disabling n-channel enhancement MOSFET 19 of FIG. 2 prevents node 34 from transitioning. Node 34, node 36, node 38, and node 39 remain in the intialized conditions. Node 36 remains in the one logic state signifying a deselect condition.

Initialization of the configurable decode circuit begins when clock signal 31 transitions from the one logic state to a zero logic state. P-channel enhancement MOSFET 18 of FIG. 2 is enabled by clock signal 31.

Inverted clock signal 29 transitions from the zero logic state to a one logic state one inverter delay after clock signal 31 transitions. N-channel enhancement MOSFET 28 of FIG. 2 is enabled by inverted clock signal 29 holding node 34 at ground thereby disabling bipolar transistor 22 of FIG. 2.

Address signals 11 in the one logic state transition to a zero logic state after inverted clock signal 29 transitions to the one logic state. All address signals are in the zero logic state causing decoding element 17 of FIG. 2 to be disabled.

P-channel enhancement MOSFET 18 of FIG. 2 charges node 33 to a logic one state after address signals 11 are in the zero logic state thereby enabling n-channel enhancement MOSFET 19 of FIG. 2.

Delayed clock signal 15 transitions from the logic one state to a logic zero state thereby disabling n-channel enhancement MOSFET 19 from charging node 34. In the preferred embodiment, p-channel enhancement MOSFET 18 of FIG. 2 charges node 33 to minimize or eliminate the time in which n-channel enhancement MOSFET 19 of FIG. 2 is enabled (by slowing charge time) when delayed clock signal 15 is in the one logic state.

Residual charge on node 52 of FIG. 2 is discharged through n-channel enhancement MOSFET 19 of FIG. 2 or through n-channel enhancement MOSFET 21 of FIG. 2 and n-channel enhancement MOSFET 28 of FIG. 2.

Other nodes in the configurable decode circuit did not change logic state during the (deselect) decode sequence and remain in the intialized condition.

The configurable decode circuit is initialized for another decoding sequence.

By now it should be appreciated that there has been provided a configurable decode circuit. The approach is optimal for use in compiled block architected SRAMs. Modification for different decode configurations in the physical layout is limited to abutting n-channel enhancement MOSFETs, which simplifies physical layout compilation. Speed is improved for high decode counts by minimizing capacitive loading on the decode stage. This is important for SRAM performance with high numbers of memory cell rows in the SRAM memory blocks. Increased performance is realized by minimizing the delay path in the select condition by using a delayed clock to drive the configurable decode output stage. The deselect condition disables the output stage which prevents a select condition from being generated. The configurable decode circuit is built to drive multiple loads corresponding to row/block decoders specific to each memory block.

We claim:

1. A configurable decode circuit for a compiled block architected static random access memory (SRAM) comprising:
   a decode circuit having a plurality of address inputs for receiving a plurality of address signals, the decode circuit providing a decoded output signal which signifies a select condition when a unique binary address is received at the address inputs, all other address input combinations generate a logic state signifying a deselect condition;
   a delayed clock signal wherein the delayed clock signal is delayed a predetermined amount of time after the address signals arrive at the decode circuit;
   a first buffer circuit receiving the decoded output signal, receiving the delayed clock signal, and providing a first buffer output signal, the first buffer circuit buffering the decoded output signal from capacitive and resistive loads, the first buffer circuit inhibited from generating a response to the decoded output signal by the delayed clock signal allowing the decoded output signal to be in the select state prior to starting a decode sequence;
   a gated transmission means receiving the first buffer output signal, receiving a delayed driver output signal, and providing a first output signal, the delayed driver output signal enables the gated transmission means for passing the first buffer output signal;
   a second buffer circuit receiving the first output signal and providing a driver output signal, the second buffer circuit buffering the gated transmission means from capacitive and resistive loads, the driver output signal logic state signifies a decode select or decode deselect condition; and
   a means for delaying the driver output signal, having an input coupled to the driver output signal, and providing the delayed driver output signal delayed by a predetermined amount of time, the means for delaying the driver output signal generates a pulse to the gated transmission means enabling the gated transmission means for a predetermined amount of time.

2. The configurable decode circuit of claim 1, wherein the decode circuit includes a decoding element comprising a parallel chain of n-channel enhancement MOSFETs for providing the plurality of address inputs and for simplifying synthesis of physical layout of the n-channel enhancement MOSFETs, the parallel chain of n-channel enhancement MOSFETs having common drain connections, having common sources coupled to ground, and having a plurality of gates, each gate receiving an address signal from the plurality of address signals thereby limiting changes to the configurable decode circuit to the decoding element when synthesizing different decode configurations, the plurality of address signals are in a logic zero state prior to starting the decode sequence thereby disabling all n-channel enhancement MOSFETs in the decoding element.

3. The configurable decode circuit of claim 2, further including a first means for precharging to initialize the common drain connections of the decoding element to a predetermined voltage prior to starting the decode sequence, the predetermined voltage corresponds to the decoded output signal signifying a logic state select condition, the means for precharging and the decoding element combine to form the decode circuit.

4. The decode circuit of claim 1, wherein the first buffer circuit comprises a n-channel enhancement MOSFET used in a voltage follower configuration having a gate for receiving the decoded output signal, having a drain for receiving the delayed clock signal, and a source corresponding to the first buffer output thereby minimizing capacitive loading on the decode circuit, the delayed clock signal strobes the first buffer circuit after the decode circuit has received the address signals and generated the decoded output signal thereby preventing the first buffer circuit from providing a false select first buffer output signal.

5. The configurable decode circuit of claim 1, wherein the gated transmission means comprises a n-channel enhancement MOSFET having a drain for receiving the first buffer output signal, a gate for receiving the delayed driver output signal, and a source for providing the first output signal, the gated transmission means is enabled by the delayed driver output signal thereby generating the first output signal.

6. The configurable decode circuit of claim 1, wherein the second buffer circuit includes a driver element for current amplification comprising a bipolar npn transistor having a base for receiving the first output signal, an emitter coupled to ground, and a collector for providing the driver output signal.

7. The configurable decode circuit of claim 6, further including a second means for precharging to initialize the collector of the driver element to a predetermined voltage prior to starting the decode sequence, the predetermined voltage at the collector of the driver element corresponds to a logic state signifying a deselect condition, the means for precharging and the driver element forming the second buffer circuit.

8. The configurable decode circuit of claim 6, wherein the means for delaying the driver signal receiving the driver output signal from the driver element and having two outputs, an inverting output and a non-inverting output, prior to starting the decode sequence the non-inverting output is in a logic state which enables the gated transmission means for passing signals.

9. The configurable decode circuit of claim 8, further including a n-channel enhancement MOSFET used to pull the driver element out of saturation after the driver output signal changes to a logic state signifying a select condition, the n-channel enhancement MOSFET having a drain coupled to the base of the driver element, having a source coupled to ground, and having a gate coupled for receiving the inverting output from the means for delaying the driver signal.

10. A deselecting decode circuit comprising:
a variable input decode circuit comprising a variable input stage which is formed by abutting a predetermined number of n-channel enhancement MOSFETs having common drain connections and having common sources coupled to ground for simplifying synthesis of a predetermined decode configuration, the predetermined number of n-channel enhancement MOSFETs having gates each receiving an address signal, the variable input decode circuit having a precharge circuit which presets the common drain connections to a logic state corresponding to a select condition prior to starting a decode sequence, the common drain connections corresponding to a deselect output and providing a decode output signal;
a n-channel enhancement MOSFET in a voltage follower configuration for inhibiting the select condition at the deselect output, the n-channel enhancement MOSFET having a gate tied to the deselect output for minimizing capacitance loading on the common drain connections of the variable input decode circuit, having a drain receiving a delayed clock signal for activating the voltage follower, and a source corresponding to the voltage follower output, and wherein the delayed clock signal is delayed a predetermined time after the start of the decode sequence to activate the voltage follower circuit after the address signals have generated a response from the variable input decode circuit and the deselect output has stabilized to a final logic state;
an output stage comprising a npn bipolar transistor for driving capacitive loads, having a base coupled to the voltage follower output for receiving a logic state corresponding to a select or deselect condition, having an emitter coupled to ground, having a collector corresponding to the deselecting decode circuit output, and having a precharge circuit which presets the collector to a voltage corresponding to a logic state corresponding to a deselect condition prior to starting the decode sequence; and
a means for pulling the npn bipolar transistor out of saturation after the deselecting decode circuit output changes to a select condition.

11. The deselecting decode circuit of claim 10, wherein the address signals coupled to the predetermined number of n-channel enhancement MOSFETs of the variable input decode circuit comprise N binary address signals the N binary address signals form $2^N$ different binary address signal combinations, the deselecting decode circuit generates a logic state signifying a select condition for a unique binary address signal combination, the address signals are in a logic zero state prior to starting the decode sequence.

12. The deselecting decode circuit of claim 11, wherein the precharge circuit of the variable input decode circuit comprises a single p-channel enhancement MOSFET to minimize capacitive loading on the variable input decode circuit output, the single p-channel enhancement MOSFET is enabled prior to the start of the decode sequence and disabled during the decode sequence.

13. The deselecting decode circuit of claim 12, wherein the precharge circuit of the output stage comprises a single p-channel enhancement MOSFET to minimize capacitive loading on the collector of the npn bipolar transistor, the single p-channel enhancement MOSFET is enabled prior to the start of the decode sequence and disabled during the decode sequence.

* * * * *